（12）United States Patent
Eklof

(10) Patent No.: US 6,914,935 B2
(45) Date of Patent: Jul. 5, 2005

(54) FRACTIONAL N SYNTHESIZER WITH REDUCED FRACTIONALIZATION SPURS

(75) Inventor: Anders Eklof, Poolesville, MD (US)

(73) Assignee: Freescale Semiconductor, Inc., Austin, TX (US)

( * ) Notice: Subject to any disclaimer, the term of this patent is extended or adjusted under 35 U.S.C. 154(b) by 712 days.

(21) Appl. No.: 09/790,445

(22) Filed: Feb. 21, 2001

(65) Prior Publication Data

US 2002/0114386 A1 Aug. 22, 2002

(51) Int. Cl.$^7$ ................................................. H03K 9/08
(52) U.S. Cl. ...................... 375/238; 375/376; 375/373; 375/327; 332/109
(58) Field of Search ................................ 375/340, 238, 375/314, 146, 354, 355, 376, 372; 713/500; 327/156; 331/8, 17, 117 R, 16; 332/109; 455/76, 574

(56) References Cited

U.S. PATENT DOCUMENTS

| | | | | |
|---|---|---|---|---|
| 4,947,407 A | * | 8/1990 | Silvian | 375/340 |
| 5,373,257 A | * | 12/1994 | Shimoda | 331/8 |
| 6,137,372 A | * | 10/2000 | Welland | 331/117 R |
| 6,208,211 B1 | * | 3/2001 | Zipper et al. | 331/17 |
| 6,208,216 B1 | * | 3/2001 | Nasila | 332/110 |
| 6,223,061 B1 | * | 4/2001 | Dacus et al. | 455/574 |
| 6,308,049 B1 | * | 10/2001 | Bellaouar et al. | 455/76 |
| 6,630,868 B2 | * | 10/2003 | Perrott et al. | 331/17 |

OTHER PUBLICATIONS

U.S. Appl. No. 60/217,208, Perrott, filed Jul. 2000.*

* cited by examiner

Primary Examiner—Shuwang Liu
Assistant Examiner—Ted Wang
(74) Attorney, Agent, or Firm—Joseph P. Lally

(57) ABSTRACT

A fractional N synthesizer is disclosed. The synthesizer includes a phase detector that receives first and second input signals and generates a pulse width modulated (PWM) output signal having a pulse width indicative of the phase relationship between the input signals. A pulse-width-to-amplitude (PW/A) conversion circuit connected to a loop filter where the conversion circuit receives the phase detector output signal and generates a PW/A output signal having an amplitude indicative of the phase detector output signal pulse width. The phase detector output signal may comprise a periodic series of pulses having varying pulse widths and the PW/A output signal amplitude changes at the end of each pulse to reflect the corresponding pulse width. The conversion circuit may include a current circuit connected to a capacitor, where the current signal receives the phase detector output and sources a constant current during a charging phase of the phase detector output signal.

6 Claims, 3 Drawing Sheets

FRACTIONAL N SYNTHESIZER WITH REDUCED FRACTIONALIZATION SPURS

FIELD OF THE INVENTION

The present invention relates to rapidly tunable phase lock loop frequency synthesizers and more particularly to fractional N synthesizers that incorporate multiple accumulators for the purpose of minimizing fractionalization spurs.

RELATED ART

Radio frequency (RF) communication systems capable of operating over a plurality of RF channels typically include frequency synthesizers for generating tunable RF signals. In frequency synthesis, it is desirable to achieve the selected frequency output rapidly with a minimum of spurious outputs. Spurious outputs can have different causes, such as harmonic distortion or imperfect suppression of undesired mixing products.

In classic phase lock loop based synthesizers, another cause of spurious outputs is often the most troublesome. In these synthesizers, spurious synthesizer outputs are present as modulation sidebands on the desired output with the modulating frequency generated at the operating frequency of the phase detector. The loop filter is typically responsible for minimizing this modulation by low pass filtering the phase detector output, blocking most of the signals at the phase detector operating frequency. In a non-fractional phase locked loop, the phase detector operating frequency is equal to the channel spacing. Thus, the phase locked loop bandwidth in a non-fractional system must be small relative to the channel spacing to minimize the spurious outputs. Unfortunately, reducing the loop bandwidth increases the time required to achieve the selected frequency.

Fractional N division overcomes this problem by allowing the phase detector to operate at a much higher frequency for the same channel spacing. This permits the phase locked loop bandwidth to be much larger thereby reducing the required lock time. Examples of fractional synthesizers are disclosed in Hietala et al, Latched Accumulator Fractional N Synthesis with Residual Error Correction, U.S. Pat. No. 5,093,632 and Hietala, Multiple Accumulator Fractional N Synthesis with Series Recombination, U.S. Pat. No. 5,166,642.

In FIG. 1, a fractional N synthesizer 100 according to the prior art includes a phase detector 102 that produces an output signal indicative of the phase differential between a reference signal 111 and a fractional input signal 113. The reference signal 111 is typically produced by a highly reliable and stable crystal oscillator circuit that may include an integer divider. Typically, phase detector 102 is of the "phase/frequency" detector variety that will be familiar to those skilled in the field of communication circuits. The output from this type of phase detector consists of pulses having a uniform amplitude. The duration of each pulse is linearly proportional to the phase difference between the two input signals. Thus, the output of phase detector 102 is a pulse width modulated waveform with a pulse repetition rate that is equal to the frequency of reference signal 111.

The output of the phase detector 102 is low pass filtered in loop filter 104. The output of loop filter 104 is a voltage signal that supplies a control input to a voltage controlled oscillator (VCO) 106. The output of VCO 106 is the desired RF signal, which has a frequency that is determined by the input voltage. The VCO output signal also provides an input to a digital fractional N divider 108. Divider 108 generates a digital output signal having a frequency that is a non-integer fraction of the frequency of the VCO output signal. The output 113 of fractional N divider 108 is provided as one of the inputs to phase detector 102, the reference signal 111 being the other. In addition, the divider output signal 113 provides a clock signal to accumulator circuit 110. Circuit 110 contains multiple, cascaded accumulators, the functionality of which is thoroughly described in the above referenced patents by Hietala et al. The output of accumulator circuit 110 periodically provides a control signal 115 to fractional N divider 108. The principle of operation of this type of circuit is well known in the present state of the art in synthesizer design and is described in the above referenced patents.

Referring now to FIG. 2, an alternative embodiment of synthesizer 100 emphasizing conversion of the phase detector output signal from a series of discrete pulses to a continuously varying voltage using a so called "charge pump" circuit identified in FIG. 2 by reference numeral 120. The conversion reduces the AC power of the phase detector output signal, particularly at the frequency of the loop reference signal. This follows practice from traditional, non-fractional N synthesizer design, where the frequency of the loop reference signal into the phase detector is relatively low, and elimination of this particular frequency is key to obtaining good loop acquisition and yet low output spurious response. In fractional N synthesizers, where the phase detector reference signal has a much higher frequency, the charge pump is less useful, since loop filter 104 can usually be designed to provide sufficient attenuation at this frequency.

In some prior art frequency synthesizers, a second signal based on the internal state of the accumulator has been generated to further reduce the spurious signals on the output of the phase detector. See, e.g., Hietala, Fractional N Frequency Synthesis with Residual Error Correction and Method Thereof, U.S. Pat. No. 5,495,206 (1996). Though this method achieves some improvement, its effectiveness is limited by the inherent nature of the signal from the phase detector. It would therefore be desirable to reduce spurious output signals in a fractional N synthesize without significantly increasing the cost or complexity of the circuit.

BRIEF DESCRIPTION OF THE DRAWINGS

The present invention is illustrated by way of example and not limitation in the accompanying figures, in which like references indicate similar elements, and in which.

Figure 1:
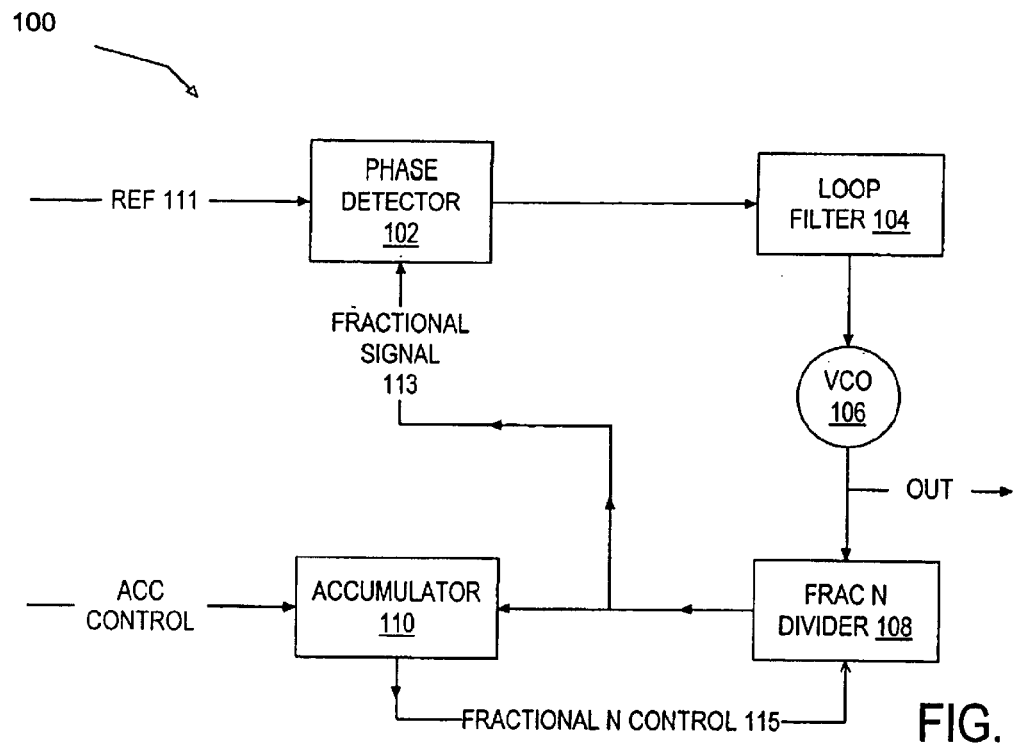
FIG. 1 is a block diagram of a fractional N synthesizer according to the prior art.

Skilled artisans appreciate that elements in the figure are illustrated for simplicity and clarity and that their sizes do not reflect their internal complexity.

DETAILED DESCRIPTION

The simulation of fractional N synthesizer circuits has typically been performed assuming that the phase detector has a linear transfer function, i.e., assuming that the phase detector faithfully produces an output signal that represents the phase difference between its inputs. Compromised performance in the actual circuit has been assumed to be due to imperfections in the implementations of the phase detector and associated circuits, and computer simulations of synthesizer performance have been based on this assumption. More accurate computer simulations made in the context of the present invention have revealed that, given the present state of the art in high speed circuit implementation, much of the discrepancy between the close-in spur level suppression of theoretical fractional N synthesizers and practical results realized by actual synthesizers is caused by the inherent operating principles of the phase detector.

Generally speaking, the present invention contemplates a fractional N frequency synthesizer that includes a circuit, referred to herein as a pulse width-to-amplitude converter (PW/A) circuit, that receives the output of the phase detector. The phase detector output is typically a pulse width modulated signal representing phase value samples where the pulse width varies according to the phase difference between the reference signal and the output of the fractional N divider circuit. The variable pulse width of the phase detector output signal results in non-uniform sampling intervals. Sampling theory predicts that non-uniform sampling intervals produce distortion of the signal spectrum. This distortion is an inherent characteristic of pulse width modulation (PWM) and occurs even though the PWM function may have a perfectly linear relationship between the input signal and the output pulse width.

The present invention converts the pulse width modulated signal produced by the phase detector to an amplitude modulated signal that has uniform sampling intervals. By converting the phase detector output to a signal with constant sampling intervals, the present invention significantly reduces the dynamic non-linear components that are inherent in a PWM signal. The elimination of these spurious signal components from the signal spectrum desirably improves synthesizer performance. In side-by-side comparison with prior art, test circuits incorporating the present invention showed tens of dB of improvement in suppression of close-in fractionalization spurs.

The high performance of a multi-accumulator fractional N synthesizers derives from the extremely precise sizing and sequencing of multiple, different integer division ratios for the fractional N divider. The variation in divider ratio produces a non-integer, "fractional" average division ratio, but also causes phase modulation of the divider output signal. When these division ratios are controlled correctly by a fractional N control signal from accumulator complex, the spectrum of the phase modulation exhibits a high pass characteristic with highly suppressed amount of close-in modulation sidebands. The degree of suppression theoretically reaches 60 dB and more at frequencies that are within a few percent of the reference frequency and less. A perfectly linear phase detector will maintain the suppression of these signals, which appear on its output as low frequency signals. It has been almost universal practice for fractional N synthesizers to use a phase detector that generates output pulses of a width proportional to the phase difference between its input signals. Any such detector will have dynamic non-linearities that significantly reduce the desired low frequency spur suppression, even if the static linearity of the device is perfect. At spur frequencies close enough to the carrier to be well within the bandwidth of the loop, the use of a charge pump has virtually no beneficial effect, as the charge and discharge "pump" pulses remain pulse width modulated. The charge pump itself does nothing to correct the dynamic non-linearity associated with the PWM.

Phase detector dynamic non-linearity reduces the high pass effect achievable for the spur frequency spectrum. A pulse width modulated signal is not a temporally uniform (equally spaced in time) set of samples, even when the pulses are all triggered by a temporally uniform start signal, and each pulse is a perfectly linear representation of the sampled signal value. Any variation in the pulse width time-shifts the "center of gravity" of the pulse energy, introducing, in effect, phase jitter in the samples. This sampling phase jitter, which follows the modulation of the pulse width, creates spurs of its own on the modulation spectrum. Low pass filtering this composite spectrum does not eliminate the spur frequencies that are within the pass band of the filter.

In fractional N synthesizers, very large accumulators are often used, and spurs can easily exist down to frequencies that are only fractions of a Hz away from the carrier. When the operating frequency of the phase detector is very high compared to the rate at which the division ratio of the divider is changed, and the division ratio shows percentage-wise small variations, the spurs caused by the PWM are many tens of dB below the carrier. However, with quad accumulator designs, employed in the highest performance synthesizers, the division ratio changes rapidly and substantially. In such a situation, the dynamic non-linearity associated with the PWM process causes spurs that greatly exceed the close-in spur levels theoretically obtainable by the fractional N principle.

The present invention removes the synthesizer performance degradations traceable in prior art to the use of a traditional phase detector having a pulse width modulated signal waveform on its output. The invention modifies the phase detector output signal format to produce instead pulses of precisely constant width and rate, but with an amplitude that varies linearly with the phase difference between the phase detector inputs.

Figure 3:
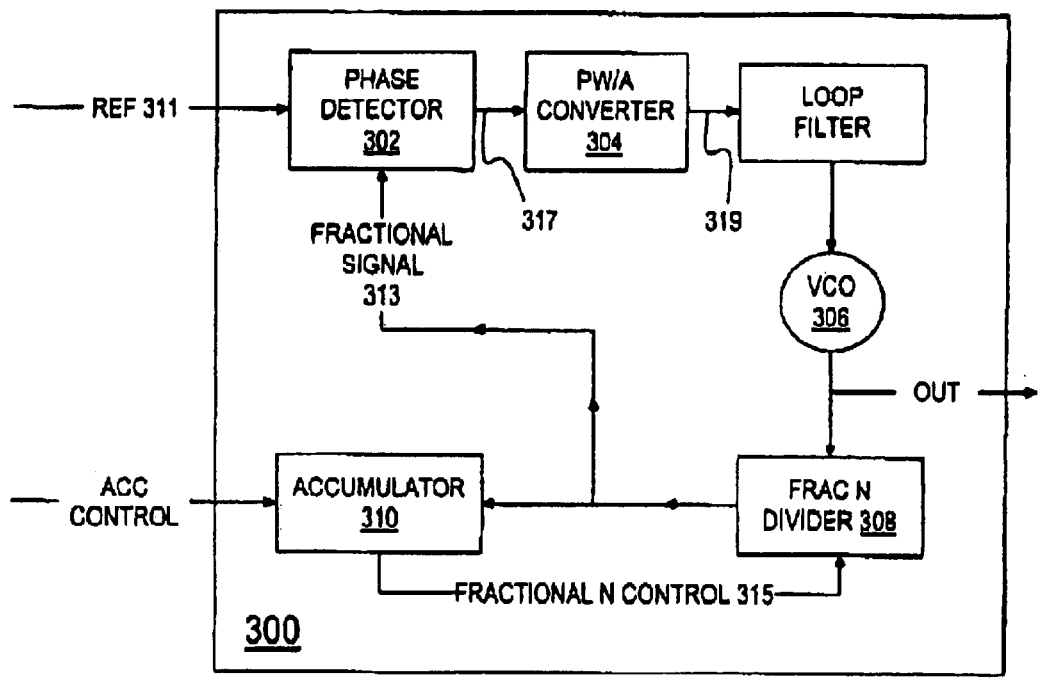
FIG. 3 is a block diagram of a fractional N synthesizer according to an embodiment of the present invention including a pulse width-to-amplitude conversion circuit for minimizing close-in spurious signals.

Referring now to FIG. 3, fractional N frequency synthesizer 300 according to one embodiment of the invention includes a phase detector 302 that receives a reference signal 311 and the output signal 313 from a fractional N divider circuit 308 as its inputs. Reference signal 311 is typically produced by a crystal oscillator circuit, possibly in combination with an integer digital divider, using a crystal that resonates at a known and reliable frequency. The accumulator 310 provides an input to fractional N divider 308 that controls the modulus of divider 308. Accumulator 310 may comprise multiple connected accumulators capable of generating complex input sequences to divider 308.

Typically, phase detector 302 is of the phase/frequency detector variety that will be familiar to those skilled in the field of communication circuits. Ideally, the output signal from this type of phase detector has a uniform amplitude (magnitude) and an individual duration that is linearly proportional to the phase difference between the two input signals. Thus, the output of phase detector 302 is a pulse width modulated waveform with a pulse repetition rate that is equal to the frequency of reference signal 311.

Figure 5:
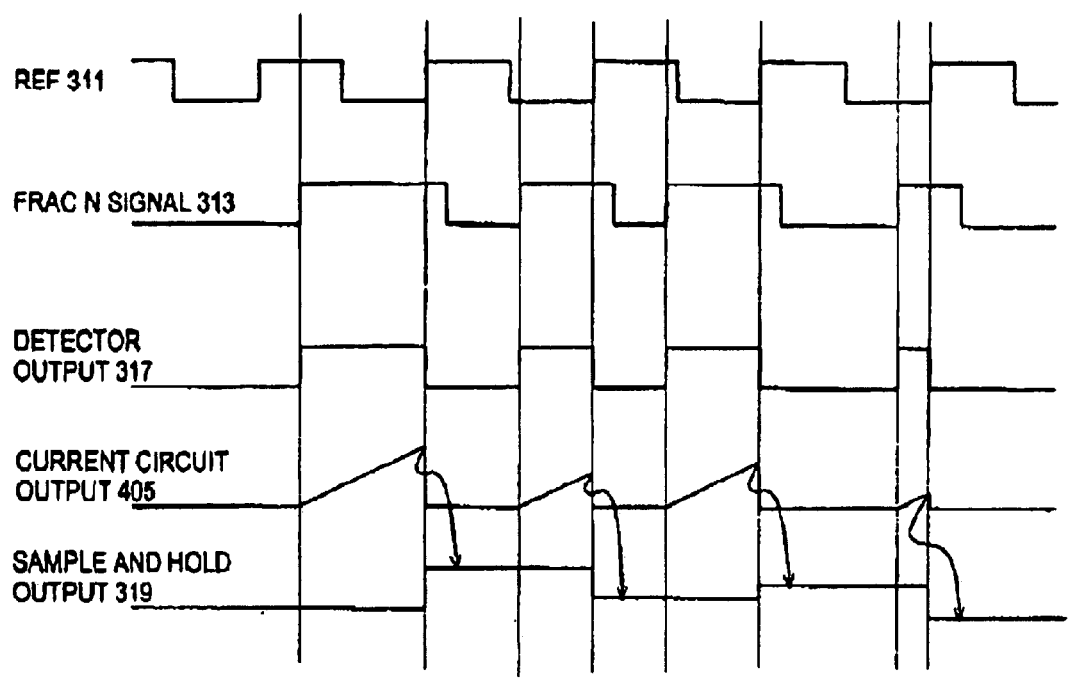
FIG. 5 is a timing diagram of selected signals in the pulse width-to-amplitude modulation conversion circuit of FIG. 4.

Phase detector 302 may produce a signal indicative of the phase difference between its two input signals. Referring to FIG. 5, a timing diagram of selected signals of fractional N synthesizer 300 is illustrated. The reference signal 311 is typically a constant frequency square wave with a duty cycle of 50%. The pulse width of the fractional N signal 313 that is output from fractional N divider 308 varies with time as the divider modulus varies. Reference signal 311 and fractional N signal 313 provide the two inputs to phase detector 302.

The fractional N divider output signal 313 may be connected to a start pulse input of phase detector 302 while the reference signal 311 may be connected to the stop pulse input of phase detector 302. In this embodiment, a positive transition of fractional N signal 313 may generate a positive transition of the phase detector output signal 317 while a positive transition of reference signal 311 may generate negative transitions of phase detector output signal 317. In this manner, the pulse width of phase detector output signal 317 varies linearly with the phase difference between fractional N signal 313 and reference signal 311.

Figure 2:
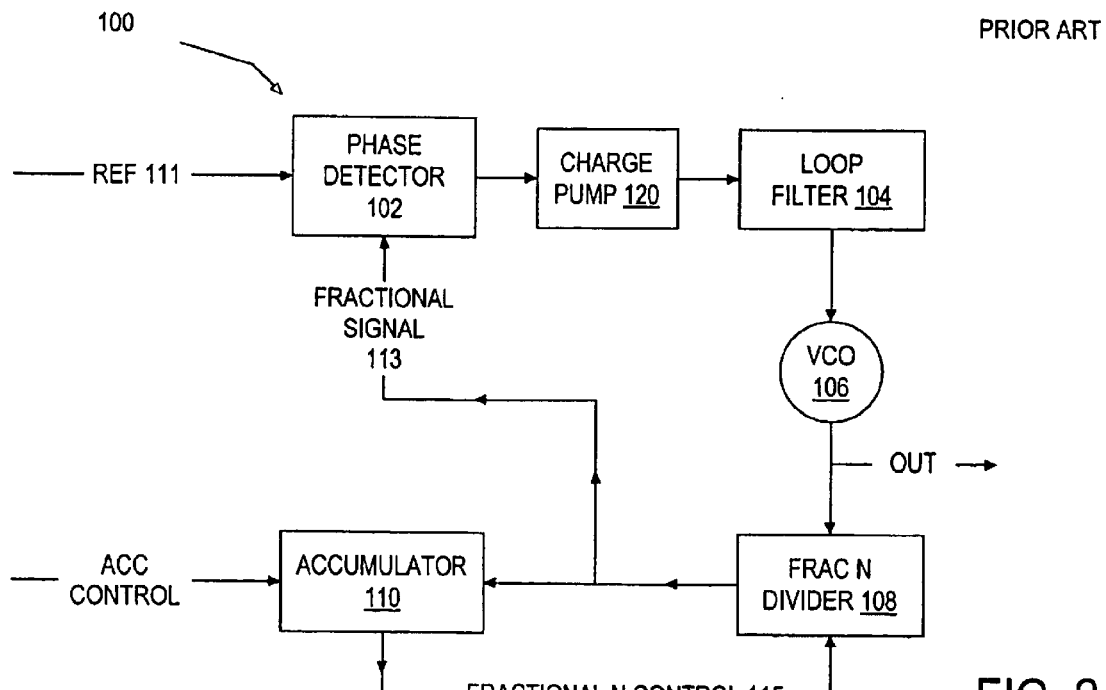
FIG. 2 is a block diagram of a fractional N synthesizer according to the prior art including a charge pump circuit that receives the phase detector output signal.

In the depicted embodiment, a pulse-width-to-amplitude (PW/A) conversion circuit 304 is substituted for the charge pump 120 of FIG. 2. Unlike charge pump 120, PW/A conversion circuit 304 eliminates the phase jitter of the phase information samples generated by the phase detector, and thus maintains a better suppression of the close-in spurs caused by the fractional N divider principle.

Figure 4:
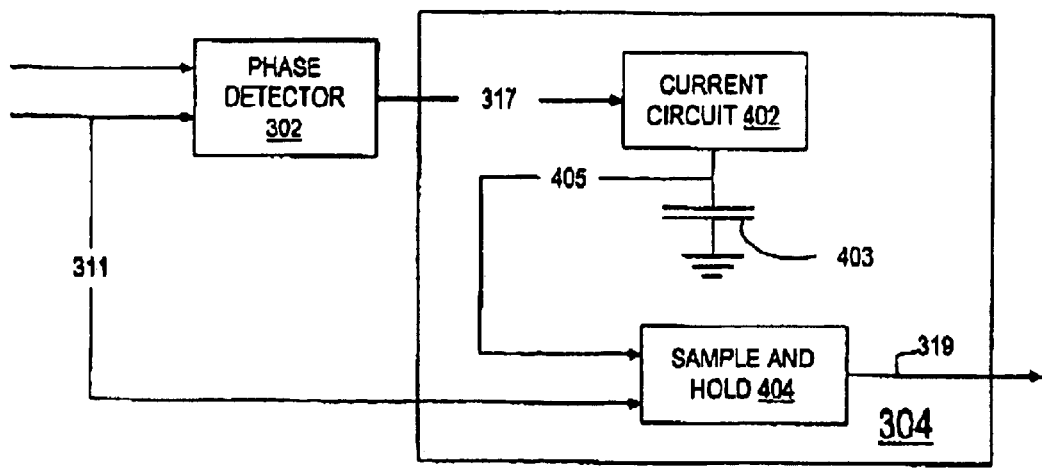
FIG. 4 is a block diagram of an embodiment of the pulse width-to-amplitude modulation conversion circuit of FIG. 3.

Referring now to FIG. 4, a suitable embodiment of PW/A conversion circuit 304 is shown. PW/A conversion circuit 304 is configured to receive phase sample pulses 317 from phase detector 302 where the width of each pulse is indicative of the phase difference between phase detector inputs 311 and 313. There is a linear relationship between the phase difference at the phase detector inputs and the width of the corresponding pulse generated by the phase detector. In the depicted embodiment, PW/A conversion circuit 304 achieves the pulse width-to-amplitude conversion with a current circuit identified by reference numeral 402. Current circuit 402 is configured to receive the phase detector output pulses 317 and to convert the width of each pulse to a voltage value. Current circuit 402 is enabled to source a constant charging current to capacitor 403 when the phase detector output signal 317 is at a logical "1." During this charging phase, the capacitor voltage rises linearly. The capacitor voltage provides an input signal to a sample-and-hold circuit 404. When the reference signal 311 transitions from logical "0" to logical "1," the phase detector output signal 317 falls to logic "0" thereby terminating the charging phase of current circuit 402 and initiating the discharge phase. During the discharge phase, current circuit 402 sources a discharging current to discharge capacitor 403 rapidly. Typically, the discharging current that current circuit 402 sinks during the discharge phase is significantly larger (in magnitude) than the charging current sourced by current circuit 402 during the charging phase. The discharging current reduces the voltage on lead 405 until the voltage reaches a hard clamp limit. The discharge phase occurs rapidly such that the voltage clamp limit is reached well before the start of the next pulse in phase detector output signal 317.

The reference signal 311 also provides an input that triggers a sample-and-hold circuit 404. At the end of the charging phase, when reference signal 311 transitions to logical "1," the capacitor voltage, which is provided to sample-and-hold circuit 404 via signal line 405, is sampled by and becomes the output signal 319 of sample-and-hold circuit 404.

The process described above is illustrated in the timing diagrams of FIG. 5. Since the voltage on line 405 starts each charging phase from the same clamp voltage and rises linearly during the phase differential period (i.e. during the time when the phase detector output signal is "1"), the voltage at the end of the charging phase is indicative of the phase relationship between signals 311 and 313. Sample-and-hold (S/H) circuit 404 captures this value for at the end of each charging phase when reference signal 311 transitions to logical "1." Note that the phase detector output pulse 317 is triggered on by the rising edge of signal 313, which is the output of the fractional N divider 308 (See FIG. 3), and terminated by the rising edge of reference signal 311, which is the stable signal from a low-noise source such as a crystal oscillator. The rising edge of 311 also captures the end value of the ramp voltage on line 405. Thus, the output 319 of S/H circuit 404 changes in temporally uniform intervals (i.e., the pulse width of the S/H circuit output signal 319 is constant). Each successive voltage value of S/H output signal 319 represents a sample value for the phase relationship of signals 311 and 313 at the input of phase detector 302. In this embodiment, the constant pulse width of the amplitude samples is equal to one cycle of signal 311 and the pulse duty cycle is therefore 100%. This incidentally minimizes the spectral energy at the reference frequency.

The constant pulse width of S/H circuit output signal 319 represents time uniform sampling that eliminates the dynamic non-linearity inherent in the PWM signal generated by phase detector 302. In this manner, the performance of synthesizer 300 as disclosed herein is beneficially enhanced.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A fractional N synthesizer, comprising:
   a phase detector configured to receive first and second input signals and further configured to generate a phase detector output signal having a pulse width indicative of the phase relationship between the first and second input signals;
   a pulse-width-to-amplitude (PW/A) conversion circuit configured to receive the phase detector output signal and enabled to generated a PW/A output signal having an amplitude indicative of the phase detector output signal pulse;
   a loop filter configured to low pass filter the PW/A output signal to generate a loop filter output having voltage;
   a voltage controlled oscillator (VCO) configured to receive the loop filter output and further configured to generate an RF output signal having a frequency determined by the loop filter output signal voltage;
   a fractional N divider circuit configured to receive the VCO output signal and further configured to generate a digital signal having a frequency that is a fraction of the VCO output signal frequency, wherein the fraction is determined by a programmable divider circuit modulus;

an accumulator circuit configured to receive the fractional N divider circuit output signal and enabled to alter the programmable divider circuit modulus;

wherein the PW/A conversion circuit includes a current circuit connected to a capacitor, wherein the current circuit is configured to receive the phase detector output signal as an input and further configured to source a constant current during a charging phase, wherein each charging phase lasts for the duration of the phase detector output signal; and wherein the current circuit is further configured to sink a current during a discharge phase, wherein the sink current is sufficient to discharge the capacitor to a predetermined clamp voltage prior to the start of the next successive charging phase.

2. The system of claim 1, wherein the output of a constant frequency oscillator comprises the first phase detector input signal.

3. The system of claim 2, wherein the output of the fractional N divider circuit comprises the second phase detector input signal.

4. The system of claim 1, wherein the phase detector output signal comprises a periodic series of pulses having varying pulse widths and wherein the amplitude of the PW/A conversion circuit output signal changes at temporally uniform intervals.

5. The system of claim 4, wherein the PW/A output signal amplitude changes at the end of each pulse to reflect the corresponding pulse width.

6. A fractional N synthesizer, comprising:
 a phase detector configured to receive first and second input signals and further configured to generate a phase detector output signal having a pulse width indicative of the phase relationship between the first and second input signals;

a pulse-width-to-amplitude (PW/A) conversion circuit configured to receive the phase detector output signal and enabled to generate a PW/A output signal having an amplitude indicative of the phase detector output signal pulse;

a loop filter configured to low pass filter the PW/A output signal to generate a loop filter output having voltage;

a voltage controlled oscillator (VCO) configured to receive the loop filter output and further configured to generate an RF output signal having a frequency determined by the loop filter output signal voltage;

a fractional N divider circuit configured to receive the VCO output signal and further configured to generate a digital signal having a frequency that is a fraction of the VCO output signal frequency, wherein the fraction is determined by a programmable divider circuit modulus;

an accumulator circuit configured to receive the fractional N divider circuit output signal and enabled to alter the programmable divider circuit modulus;

wherein the PW/A conversion circuit includes a current circuit connected to a capacitor having voltage, wherein the current circuit is configured to receive the phase detector output signal as an input and further configured to source a constant current during a charging phase, wherein each charging phase lasts for the duration of the phase detector output signal;

wherein the capacitor voltage provides a sample input to a sample-and-hold (S/H) circuit; and wherein the first input signal provides a trigger input to the S/H circuit.

* * * * *